(12) United States Patent
Pfuetzner et al.

(10) Patent No.: US 8,685,807 B2
(45) Date of Patent: Apr. 1, 2014

(54) METHOD OF FORMING METAL GATES AND METAL CONTACTS IN A COMMON FILL PROCESS

(75) Inventors: Ronny Pfuetzner, Dresden (DE); Ralf Richter, Dresden (DE); Jens Heinrich, Wachau (DE)

(73) Assignee: GLOBALFOUNDRIES Inc., Grand Cayman (KY)

( * ) Notice: Subject to any disclaimer, the term of this patent is extended or adjusted under 35 U.S.C. 154(b) by 271 days.

(21) Appl. No.: 13/100,798

(22) Filed: May 4, 2011

(65) Prior Publication Data
US 2012/0282765 A1    Nov. 8, 2012

(51) Int. Cl.
*H01L 21/336*    (2006.01)
(52) U.S. Cl.
USPC ..................................... 438/183; 257/E21.19
(58) Field of Classification Search
USPC ............... 257/410, E21.19, E29.242; 438/99, 438/183, 184, 622, 770
See application file for complete search history.

(56) References Cited

U.S. PATENT DOCUMENTS

| | | | |
|---|---|---|---|
| 6,444,592 B1* | 9/2002 | Ballantine et al. | 438/770 |
| 6,506,673 B2* | 1/2003 | Ma et al. | 438/622 |
| 2002/0142531 A1* | 10/2002 | Hsu et al. | 438/183 |
| 2005/0148131 A1* | 7/2005 | Brask | 438/199 |
| 2006/0128055 A1* | 6/2006 | Cheng et al. | 438/83 |
| 2010/0289094 A1 | 11/2010 | Reichel et al. | |
| 2011/0272767 A1* | 11/2011 | Yin et al. | 257/412 |

* cited by examiner

*Primary Examiner* — Lex Malsawma
(74) *Attorney, Agent, or Firm* — Amerson Law Firm, PLLC

(57) ABSTRACT

The method described herein involves a method of forming metal gates and metal contacts in a common fill process. The method may involve forming a gate structure comprising a sacrificial gate electrode material, forming at least one conductive contact opening in a layer of insulating material positioned adjacent the gate structure, removing the sacrificial gate electrode material to thereby define a gate electrode opening, and performing a common deposition process to fill the conductive contact opening and the gate electrode opening with a conductive fill material.

17 Claims, 4 Drawing Sheets

US 8,685,807 B2

METHOD OF FORMING METAL GATES AND METAL CONTACTS IN A COMMON FILL PROCESS

BACKGROUND OF THE INVENTION

1. Field of the Invention

The present disclosure is generally directed to the field of semiconductor processing, and, more particularly, to a method of forming metal gate structures and metal contacts in a common fill process.

2. Description of the Related Art

There is a constant drive within the semiconductor industry to increase the operating speed of integrated circuit devices, e.g., microprocessors, memory devices, etc. This drive is fueled by consumer demands for computers and electronic devices that operate at increasingly greater speeds. This demand for increased speed has resulted in a continual reduction in the size of semiconductor devices, e.g., transistors. That is, the size of many components of a typical field effect transistor, e.g., channel length, source/drain junction depths, gate dielectric thickness, etc., are reduced. For example, all other things being equal, the smaller the channel length of the transistor, the faster the transistor will operate. Thus, there is a constant drive to reduce the size, or scale, of the components of a typical transistor to increase the overall speed of the transistor, as well as integrated circuit devices incorporating such transistors.

By way of background, many semiconductor devices, e.g., transistors, may be manufactured using either a "gate-first" technique or a "gate-last" technique. The techniques selected depends upon many factors, such as the type of device under construction, the desired performance characteristics, etc. As it relates to transistors, in a typical "gate-first" approach, the final gate electrode structure is formed earlier in the process as compared to when the final gate electrode is formed in a typical "gate-last" approach. More specifically, in a "gate-first" approach, the gate material is deposited on a previously formed gate insulation layer, and thereafter an etching process is performed to define the final gate electrode. Processing continues with the formation of other related structure, e.g., source/drain regions, sidewall spacers, silicide regions, etc., with the final gate electrode in place In the "gate-first" technique, the final gate electrode must be made of a material that is able to withstand all of the subsequent processing operations, e.g., various heat treatments, etc. For that reason, use of the "gate-first" technique tends to limit the material that may be used for the gate electrode. In contrast, in the "gate-last" technique, a "dummy gate" material is formed early in the process and serves as a placeholder for what will ultimately be the final gate electrode structure. At some point after other aspects of the transistor have been formed, e.g., after the source/drain regions, the sidewall spacers, etc. have been formed, the dummy gate material will be removed and a replacement gate electrode material will be formed in its place. This replacement gate electrode is the final gate electrode for the transistor. Since the replacement gate electrode material is not subject to all of the processing conditions that the gate electrode in a "gate-first" technique is subjected to, the final gate electrode in a "gate-last" technique may be made of a variety of different metals or other conductive material. Thus, the "gate-last" technique gives designers more flexibility as to the final gate electrode material which can be important in the ultimate performance of the device.

In a typical "gate-last" approach, the contacts to the active area are formed at a different time than when the replacement gate electrode is formed. One problem with this typical technique is that it involves multiple deposition and chemical mechanical polishing ("CMP") steps. Among other things, CMP steps tend to create defects, such as microscratches, slurry defects, and the like, all of which tend to reduce product yields.

The present invention is directed to solving, or at least reducing, some or all of the aforementioned problems.

SUMMARY OF THE INVENTION

The following presents a simplified summary of the invention in order to provide a basic understanding of some aspects of the invention. This summary is not an exhaustive overview of the invention. It is not intended to identify key or critical elements of the invention or to delineate the scope of the invention. Its sole purpose is to present some concepts in a simplified form as a prelude to the more detailed description that is discussed later.

A novel method for forming gate electrode structures and conductive contacts in a common fill process is disclosed herein. In one illustrative embodiment, the method includes forming a gate structure comprising a sacrificial gate electrode material, forming at least one conductive contact opening in a layer of insulating material positioned adjacent the gate structure, removing the sacrificial gate electrode material to thereby define a gate electrode opening, and performing a common deposition process to fill the conductive contact opening and the gate electrode opening with a conductive fill material.

In another illustrative embodiment, the method includes forming a gate structure comprising a gate insulation layer, a high-k layer positioned above the gate insulation layer, and a sacrificial gate electrode material positioned above the high-k layer, forming at least one conductive contact opening in a layer of insulating material positioned adjacent the gate structure, removing the sacrificial gate electrode material to thereby define a gate electrode opening, performing a common deposition process to fill the conductive contact opening and the gate electrode opening with a conductive fill material, and performing a planarization process to remove portions of the conductive fill material positioned outside of the conductive contact opening and the gate electrode opening.

BRIEF DESCRIPTION OF THE DRAWINGS

The disclosure may be understood by reference to the following description taken in conjunction with the accompanying drawings, in which like reference numerals identify like elements, and in which.

Figure 1A:
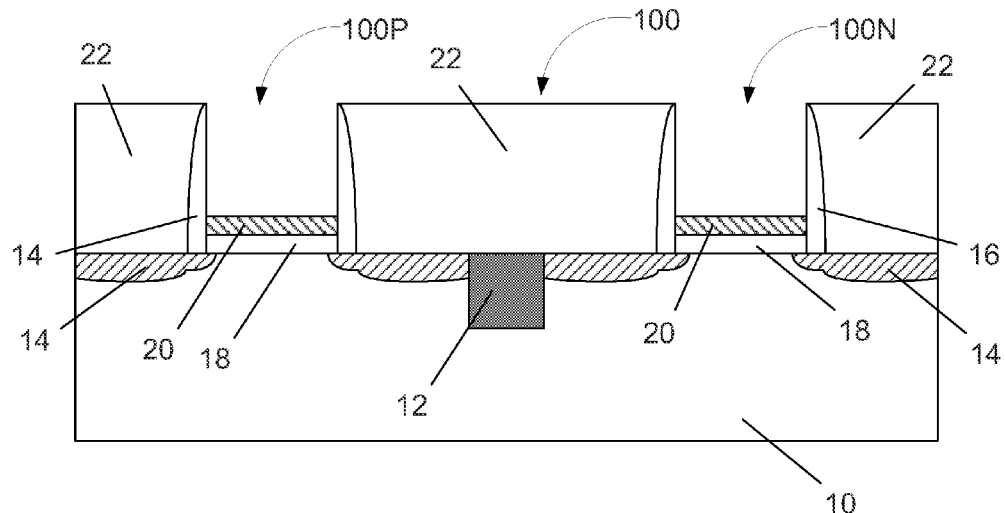
FIGS. 1A-1G depict one illustrative process flow involving the subject matter disclosed herein.

While the subject matter disclosed herein is susceptible to various modifications and alternative forms, specific embodiments thereof have been shown by way of example in the drawings and are herein described in detail. It should be understood, however, that the description herein of specific embodiments is not intended to limit the invention to the particular forms disclosed, but on the contrary, the intention is to cover all modifications, equivalents, and alternatives falling within the spirit and scope of the invention as defined by the appended claims.

DETAILED DESCRIPTION

Various illustrative embodiments of the present subject matter are described below. In the interest of clarity, not all features of an actual implementation are described in this specification. It will of course be appreciated that in the development of any such actual embodiment, numerous implementation-specific decisions must be made to achieve the developers' specific goals, such as compliance with system-related and business-related constraints, which will vary from one implementation to another. Moreover, it will be appreciated that such a development effort might be complex and time-consuming, but would nevertheless be a routine undertaking for those of ordinary skill in the art having the benefit of this disclosure.

The present subject matter will now be described with reference to the attached figures. Various structures and devices are schematically depicted in the drawings for purposes of explanation only and so as to not obscure the present disclosure with details that are well known to those skilled in the art. Nevertheless, the attached drawings are included to describe and explain illustrative examples of the present disclosure. The words and phrases used herein should be understood and interpreted to have a meaning consistent with the understanding of those words and phrases by those skilled in the relevant art. No special definition of a term or phrase, i.e., a definition that is different from the ordinary and customary meaning as understood by those skilled in the art, is intended to be implied by consistent usage of the term or phrase herein. To the extent that a term or phrase is intended to have a special meaning, i.e., a meaning other than that understood by skilled artisans, such a special definition will be expressly set forth in the specification in a definitional manner that directly and unequivocally provides the special definition for the term or phrase.

In general, the present disclosure is directed to method for forming replacement gate electrode structures and conductive contacts in a common fill process on a semiconductor device. As will be readily apparent to those skilled in the art upon a complete reading of the present application, the present method is applicable to a variety of technologies, e.g., NMOS, PMOS, CMOS, etc., and is readily applicable to a variety of devices, including, but not limited to, logic devices, memory devices, resistors, conductive lines, etc.

FIG. 1A depicts an illustrative device 100 that is generally comprised of a partially formed NFET transistor 100N and a partially formed PFET transistor 100P formed in and above a semiconducting substrate 10. The illustrative transistors 100N, 100p are separated by an illustrative isolation structure 12, e.g., a shallow trench isolation structure, formed in the substrate 10. In one illustrative embodiment, the semiconducting substrate 10 is comprised of silicon. In the embodiments depicted herein, the substrate 10 is depicted in a bulk configuration. However, the present invention is equally applicable to other configurations, such as a silicon-on-insulator (SOI) type structures. Thus, the terms substrate or semiconductor substrate should be understood to cover all semiconductor structures.

At the stage of manufacture depicted in FIG. 1A, the transistors 100N, 100P are each comprised of source/drain regions 14, sidewall spacers 16, a gate insulation layer 18, and a high-k insulation layer 20. The partially formed transistors 100N, 100P are positioned in a layer of insulating material 22, e.g., silicon dioxide, that is formed above the substrate 10. The sidewall spacers 16 were formed adjacent a polysilicon "gate electrode" which has been removed in the view shown in FIG. 1A.

The illustrative transistors 100N, 100P depicted herein are formed using a gate-last technique. The various components and structures of the transistors 100n, 100P may be formed using a variety of known techniques and materials. For example, the gate insulation layer 18 may be comprised of a variety of materials, e.g., silicon dioxide, silicon nitride, an oxynitride, a silicon nitride/silicon dioxide bilayer, etc., and it may be formed by a variety of techniques, e.g., chemical vapor deposition (CVD), low pressure chemical vapor deposition (LPCVD), thermal growth, etc. In one illustrative embodiment, the gate insulation layer 16 is comprised of a thermally grown layer of silicon dioxide having a thickness ranging from approximately 1-4 nm. Similarly, the high-k layer 20 may be comprised of a variety of materials having a dielectric constant greater that 10, e.g., hafnium oxide, zirconium oxide, etc. The high-k layer 20 may be formed by a variety of techniques, e.g., chemical vapor deposition (CVD), atomic layer deposition (ALD), low pressure chemical vapor deposition (LPCVD), etc. In one illustrative embodiment, the high-k layer 20 may have a thickness of less that approximately 10 nm.

The sidewall spacers 16 may be formed by forming an appropriate layer(s) (not shown) of material above the surface of the substrate 10 and thereafter performing an anisotropic etching process to define the sidewall spacers 16. As noted above, the sidewall spacers 16 were form adjacent a polysilicon "gate electrode" which has been removed at the point of fabrication depicted in FIG. 1A. The source/drain regions 14 may be formed by performing well known ion implantation techniques using well-known dopant materials.

Figure 1B:
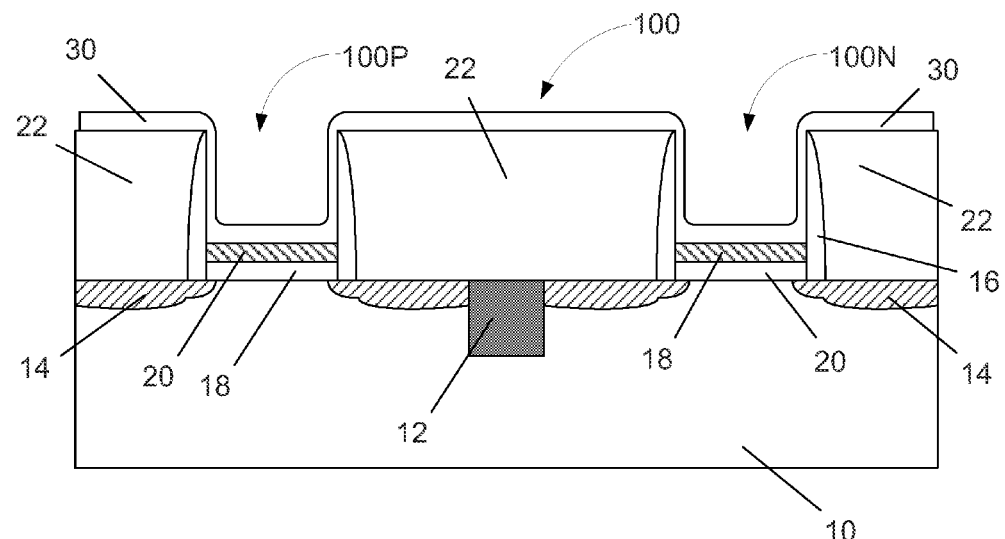

As shown in FIG. 1B, a work function metal layer 30 is conformally deposited above the transistors 100N, 100P. The work function metal layer 30 may be comprised of a variety of materials, e.g., titanium nitride, depending upon the particular application, and it may be formed by a variety of techniques, e.g., physical vapor deposition (PVD), etc. In one illustrative embodiment, the work function metal layer 30 is a layer of titanium nitride having a thickness less than approximately 10 nm.

Figure 1C:
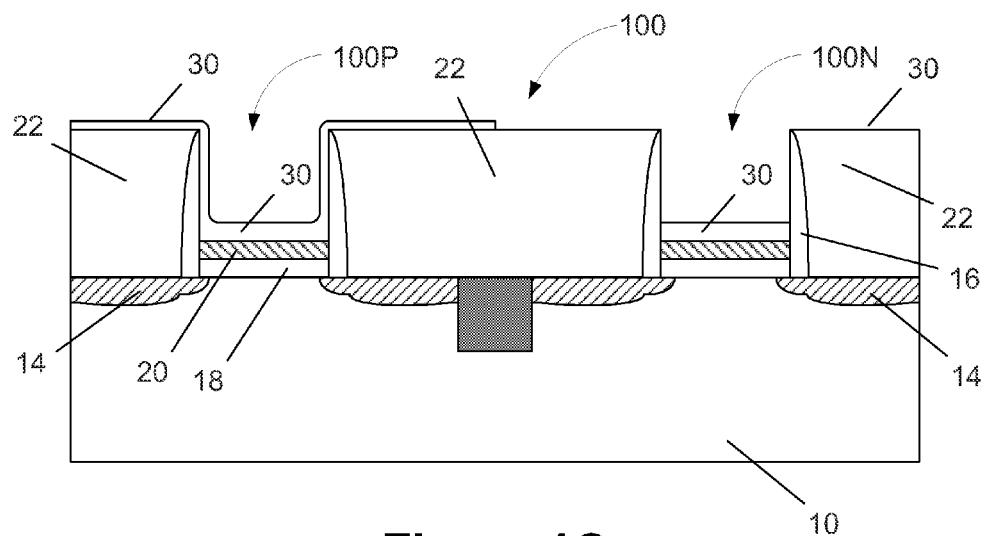

FIG. 1C depicts the device 100 after portions of the work function metal layer 30 has been removed from the NFET transistor 100N. Portions of the work function metal layer 30 may be removed by forming a masking layer (not shown), e.g., a resist mask, above the PFET transistor 100P and thereafter performing a dry or wet etching process to remove the desired portions of the work function metal layer 30 from the NFET transistor 100N. Note that the parameters of the etching process are selected and controlled such that portions of the work function metal layer 30 remain above the high-k layer 20 in the NFET transistor 100N. In the PFET transistor 100P, the work function metal layer 30 remains positioned above the high-k layer 20 and on the sidewalls of the spacers 16. A process, such as a CMP process, may be performed to remove portions of the work function metal layer 30 positioned above the layer of insulating material 22.

Figure 1D:
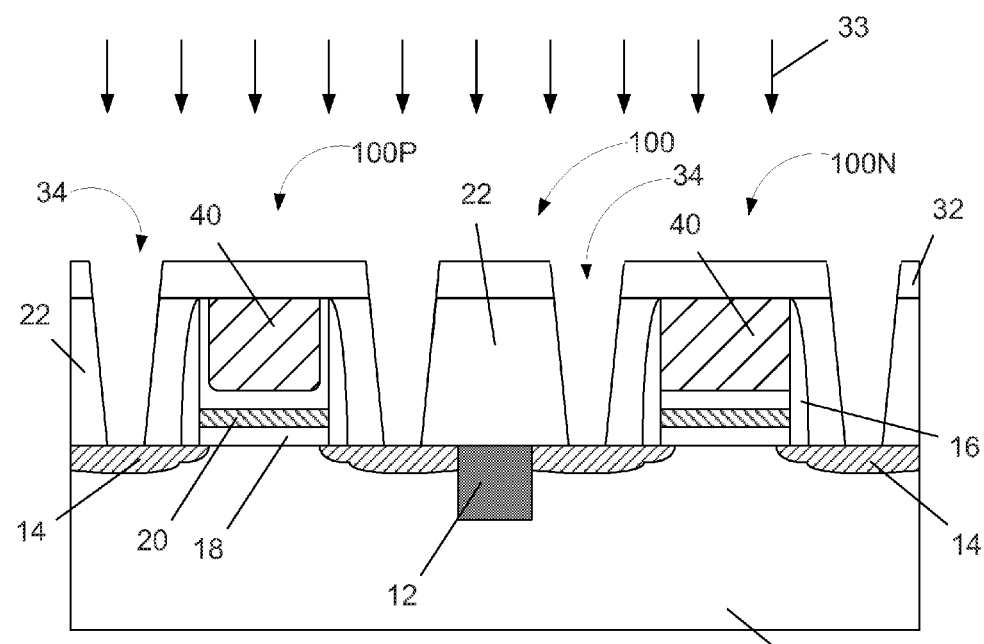

FIG. 1D depicts the device 100 at a point of fabrication wherein a sacrificial gate material 40 has been formed in the gate structures of the transistors 100N, 100P. Also depicted in FIG. 1D is a patterned masking layer 32, e.g., a resist mask, that has be formed above the device 100 using known techniques. As indicated, the masking layer 32 is used when an etching process 33 is performed to define contact openings 34 in the insulating layer 22. Conductive contacts that conductively contact portions of the transistors 100N, 100P, e.g., the source/drain regions 14, will be formed in the openings 34. The sacrificial gate material 40 may be comprised of a variety of different materials and that may be formed by a variety of different processes. For example, the sacrificial gate material 40 may be a spin-on type of material or it may be a deposited process layer, like polysilicon. In one illustrative embodiment, the sacrificial gate material 40 is a wet gap fill (WGF) type of material that may be applied using a spin-on technique and subsequently cured. If a process layer of, for example, polysilicon is formed to serve as the sacrificial gate material 40, then a deposition process followed by a CMP process may be performed to remove excess portions of the deposited layer of polysilicon.

Figure 1E:
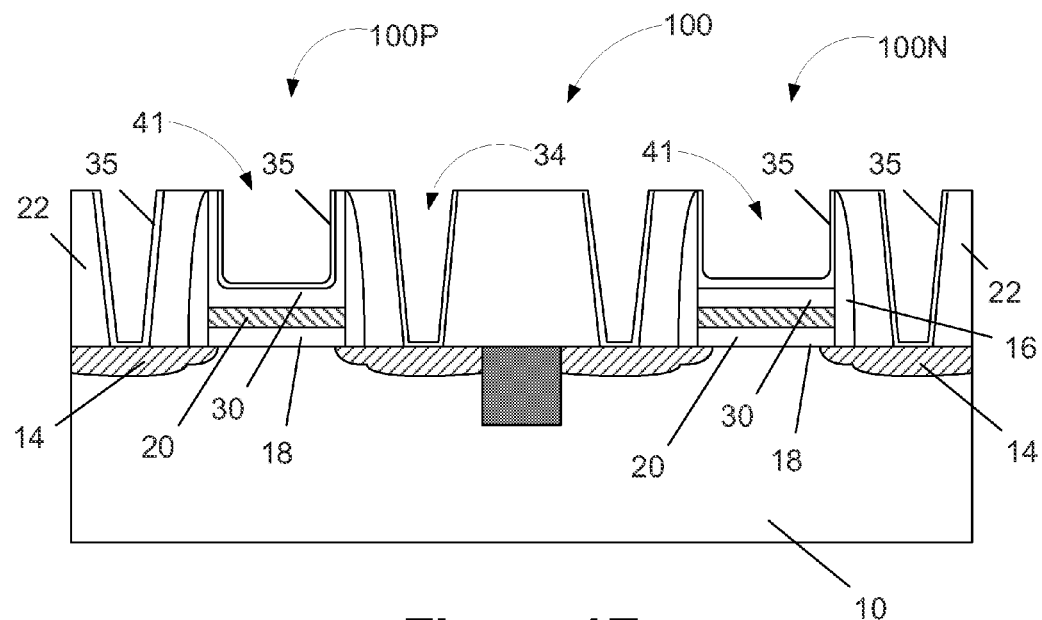

In FIG. 1E, the device 100 is depicted at the point of fabrication where the sacrificial gate material 40 and the masking layer 32 has been removed. The removal of the sacrificial gate material defines a gate electrode opening 41 in which final gate electrodes for the device 100 will be formed. FIG. 1E further depicts the device 100 after another work function metal layer 35 has been formed for the transistors 100N, 100P and in the openings 34. The techniques employed to remove the sacrificial gate material 40 may vary depending upon the particular materials used for the sacrificial gate material 40. For example, if the sacrificial gate material 40 is comprised of polysilicon, then one or more masking and etching processes may need to be performed to remove the polysilicon. In the case where the sacrificial gate material 40 is made of a spin-on type material, wet gap fill, then such a material may be removed by subjecting the device 100 to a solvent or acid bath that only attacks the sacrificial gate material 40. The work function metal layer 35 may be comprised of a variety of materials, and it may be formed using a variety of techniques. In one illustrative embodiment, the work function metal layer 35 may be comprised of titanium nitride, it may have a thickness of less than 10 nm, and it may be formed using and physical vapor deposition process (PVD).

Figure 1F:
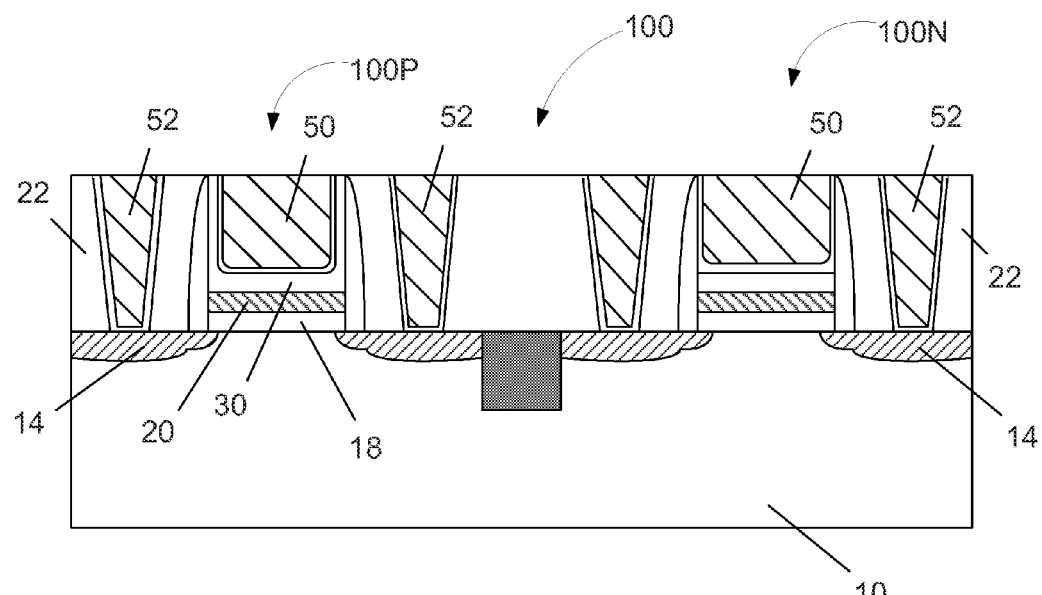

As shown in FIG. 1F, the next process involves forming the final gate electrodes 50 and the conductive contacts 52 for the device 100 in a common fill process. The final gate electrodes 50 and the conductive contacts 52 may be comprised of any of a variety of conductive materials, e.g., aluminum, tungsten. The selection of the appropriate material for the final gate electrodes 50 and the conductive contacts 52 may vary depending upon the particular application. The formation of the final gate electrodes 50 and the conductive contacts 52 may be accomplished by performing a deposition process to overfill the desired opening and thereafter performing a CMP process to remove excess portions of the deposited layer.

Figure 1G:
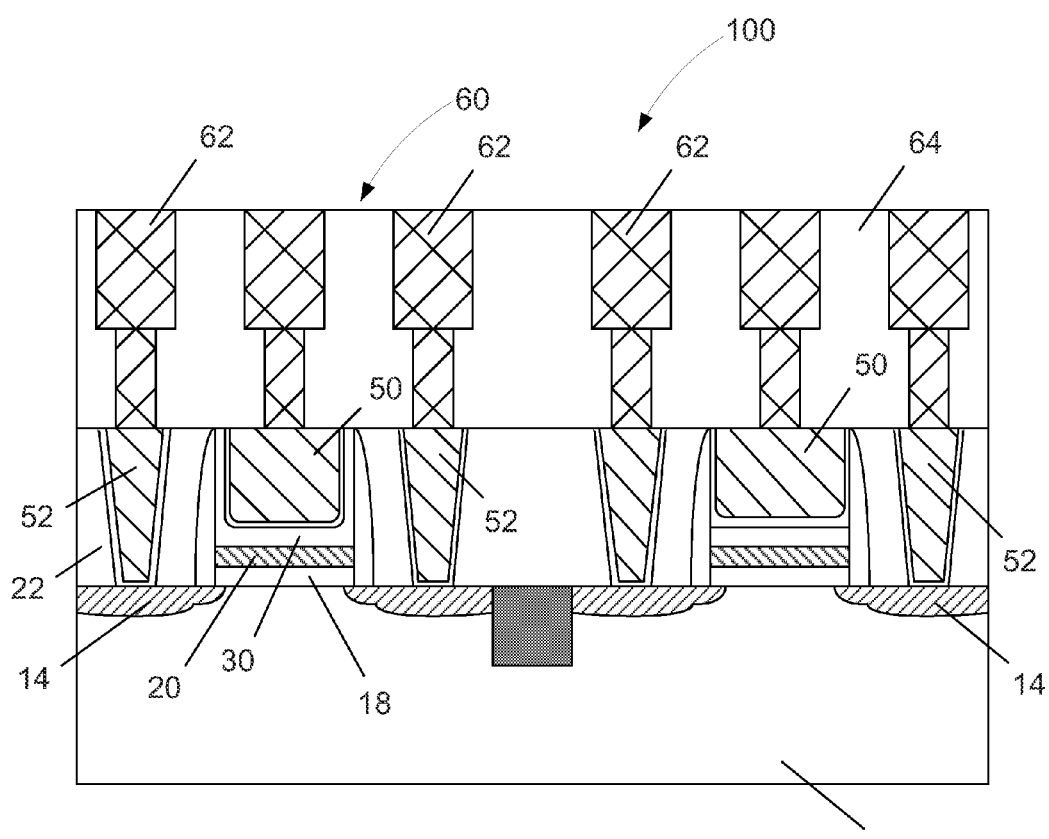

Next, as shown in FIG. 1G, well-known additional processing steps are performed to form a metallization layer 60 on the device 100. The metallization layer 60 is comprised of a plurality of conductive members 62, e.g., metal lines and/or contacts, formed in a layer of insulating material 64. The size, shape, configuration and materials of construction for the conductive members 62 may vary depending on the particular application, e.g., the conductive members 62 may be comprised of aluminum, tungsten, copper, etc. Similarly, the insulating material 64 may be comprised of, for example, a low-k material (k value less than 3), a high-k material, silicon dioxide, etc.

The particular embodiments disclosed above are illustrative only, as the invention may be modified and practiced in different but equivalent manners apparent to those skilled in the art having the benefit of the teachings herein. For example, the process steps set forth above may be performed in a different order. Furthermore, no limitations are intended to the details of construction or design herein shown, other than as described in the claims below. It is therefore evident that the particular embodiments disclosed above may be altered or modified and all such variations are considered within the scope and spirit of the invention. Accordingly, the protection sought herein is as set forth in the claims below.

What is claimed:

1. A method, comprising:
   forming a dummy gate electrode above a semiconductor substrate;
   forming sidewall spacers adjacent said dummy gate electrode;
   forming a layer of insulating material above said substrate and adjacent said sidewall spacers;
   performing at least one etching process to remove at least said dummy gate electrode and thereby define a space between said spacers;
   forming high-k layer of insulting material in said space between said spacers;
   forming a work function metal layer in said space between said spacers and above said high-k layer of insulating material;
   forming a sacrificial gate electrode material within said space defined by said spacers and above said work function metal layer;
   forming at least one conductive contact opening in said layer of insulating material;
   after forming said at least one conductive contact opening, removing said sacrificial gate electrode material to thereby define a gate electrode opening; and
   performing a common deposition process to fill said conductive contact opening and said gate electrode opening with a conductive fill material.

2. The method of claim 1, further comprising performing a planarization process to remove portions of said conductive fill material positioned outside of said conductive contact opening and said gate electrode opening.

3. The method of claim 1, wherein said conductive fill material comprises at least one of aluminum, tungsten and copper.

4. The method of claim 1, wherein forming said sacrificial gate electrode material comprises performing a deposition process to form said sacrificial gate electrode material.

5. The method of claim 1, wherein forming said sacrificial gate electrode material comprises performing a spin-on process to form said sacrificial gate electrode material.

6. The method of claim 1, wherein said sacrificial gate electrode material comprises a wet gap fill material.

7. The method of claim 1, further comprises, prior to forming said high-k layer of insulating material, forming a gate insulation layer on said substrate within said spacer defined by said spacers and wherein said high-k layer of insulating material is formed on said gate insulation layer.

8. The method of claim 1, wherein said conductive fill material in said conductive contact opening is electrically coupled to a source or drain region of a transistor.

9. The method of claim 1, wherein removing said sacrificial gate electrode material comprises performing an etching process.

10. A method, comprising:
    forming a dummy gate electrode above a semiconductor substrate;
    forming sidewall spacers adjacent said dummy gate electrode;
    forming a layer of insulating material above said substrate and adjacent said sidewall spacers;
    performing at least one etching process to remove at least said dummy gate electrode and thereby define a space between said spacers;
    forming a gate structure within said space defined by said spacers, said gate structure comprising a gate insulation layer, a high-k layer positioned above said gate insulation layer, a work function metal positioned above said high-k layer and a sacrificial gate electrode material positioned above said work function metal layer;

forming at least one conductive contact opening in said layer of insulating material;

after forming said at least one conductive contact opening, removing said sacrificial gate electrode material to thereby define a gate electrode opening;

performing a common deposition process to fill said conductive contact opening and said gate electrode opening with a conductive fill material; and performing a planarization process to remove portions of said conductive fill material positioned outside of said conductive contact opening and said gate electrode opening.

11. The method of claim 10, wherein forming said gate structure comprises performing a deposition process to form said sacrificial gate electrode material.

12. The method of claim 10, wherein forming said gate structure comprises performing a spin-on process to form said sacrificial gate electrode material.

13. The method of claim 10, wherein said conductive fill material in said conductive contact opening is electrically coupled to a source or drain region of a transistor.

14. The method of claim 10, wherein removing said sacrificial gate electrode material comprises performing an etching process.

15. A method, comprising:

forming a dummy gate electrode above a semiconductor substrate;

forming sidewall spacers adjacent said dummy gate electrode;

forming a layer of insulating material above said substrate and adjacent said sidewall spacers;

performing at least one etching process to remove at least said dummy gate electrode and thereby define a space between said spacers;

forming a high-k layer of insulating material in said space between said spacers;

forming a work function metal layer in said space between said spacers and above said high-k layer of insulating material;

performing a spin-on process to form a sacrificial gate electrode material of a gate structure within said space defined by said spacers;

forming at least one conductive contact opening in said layer of insulating material;

removing said sacrificial gate electrode material to thereby define a gate electrode opening;

performing a common deposition process to fill said conductive contact opening and said gate electrode opening with a conductive fill material, wherein said conductive fill material comprises at least one of aluminum, tungsten and copper; and performing a planarization process to remove portions of said conductive fill material positioned outside of said conductive contact opening and said gate electrode opening.

16. The method of claim 15, further comprising, prior to forming said high-k layer of insulating material, forming a gate insulating layer on said substrate within said spacer defined by said spacers and wherein said high-k layer of insulating material is formed on said gate insulating layer.

17. The method of claim 15, wherein said conductive fill material in said conductive contact opening is electrically coupled to a source or drain region of a transistor.

* * * * *

UNITED STATES PATENT AND TRADEMARK OFFICE
CERTIFICATE OF CORRECTION

PATENT NO. : 8,685,807 B2
APPLICATION NO. : 13/100798
DATED : April 1, 2014
INVENTOR(S) : Pfuetzner et al.

It is certified that error appears in the above-identified patent and that said Letters Patent is hereby corrected as shown below:

In the Claims

In claim 1, at column 6, line 12, delete "forming high-k layer of insulting material" and insert therefor -- forming a high-k layer of insulating material --.

In claim 7, at column 6, line 43, delete "comprises" and insert therefor -- comprising --.

In claim 16, at column 8, line 27, delete "insulating" and insert therefor -- insulation --.

In claim 16, at column 8, line 29, delete "insulating" and insert therefor -- insulation --.

Signed and Sealed this
Second Day of September, 2014

Michelle K. Lee
*Deputy Director of the United States Patent and Trademark Office*